(12) United States Patent
Hayashi et al.

(10) Patent No.: US 6,383,288 B1
(45) Date of Patent: May 7, 2002

(54) METHOD OF FORMING DIAMOND FILM

(75) Inventors: Kazushi Hayashi; Yoshihiro Yokota; Koji Kobashi, all of Kobe (JP)

(73) Assignee: Kabushiki Kaisha Kobe Seiko Sho, Kobe (JP)

( * ) Notice: Subject to any disclaimer, the term of this patent is extended or adjusted under 35 U.S.C. 154(b) by 0 days.

(21) Appl. No.: 09/232,903

(22) Filed: Jan. 19, 1999

(30) Foreign Application Priority Data

Jan. 16, 1998 (JP) ............................................ 10-020387

(51) Int. Cl.⁷ .............................................. C30B 29/04
(52) U.S. Cl. ...................... 117/929; 427/249.8; 423/446
(58) Field of Search .................. 427/249.8; 117/89, 117/90, 94, 929; 423/446

(56) References Cited

U.S. PATENT DOCUMENTS

| | | |
|---|---|---|
| 5,479,875 A | 1/1996 | Tachibana et al. |
| 5,814,149 A * | 9/1998 | Shintani et al. ............. 117/108 |
| 5,863,324 A * | 1/1999 | Kobashi et al. ............... 117/89 |

FOREIGN PATENT DOCUMENTS

| | | |
|---|---|---|
| JP | 59-27754 | 7/1984 |
| JP | 61-3320 | 1/1986 |
| JP | 04-106923 | * 4/1992 |
| JP | 08-151296 | * 6/1996 |
| JP | 9-48693 | 2/1997 |

OTHER PUBLICATIONS

J. F. Denatale, et al., Journal of Materials Science, vol. 27, pp. 553–556, "Adhesion Improvement in Diamond Films by Microlithographic Patterning", 1992.

Yoshihiro Shintani, Journal of Materials Research Society, vol. 11, No. 12, pp. 2955–2956, "Growth of Highly (111)–Oriented, Highly Coalesced Diamond Films on Platinum (111) Surface: A Possibility of Heteroepitaxy", Dec. 1996.

* cited by examiner

*Primary Examiner*—Bret Chen
(74) *Attorney, Agent, or Firm*—Oblon, Spivak, McClelland, Maier & Neustadt, P.C.

(57) ABSTRACT

A method of forming a diamond film includes synthesizing a diamond film on a surface of a substrate, where the surface of the substrate has trenches. The trenches inhibit delamination of the diamond film.

13 Claims, 1 Drawing Sheet

FIG. 1
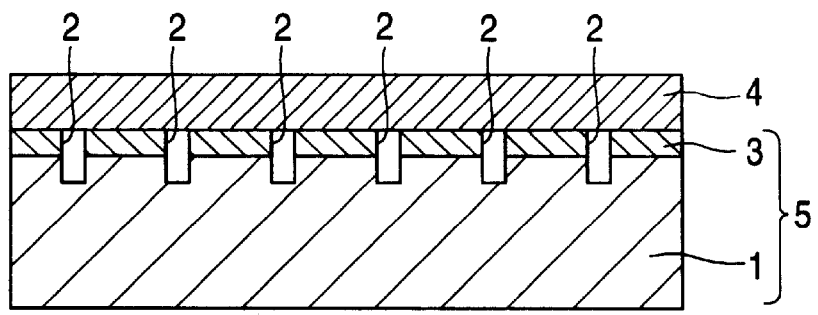
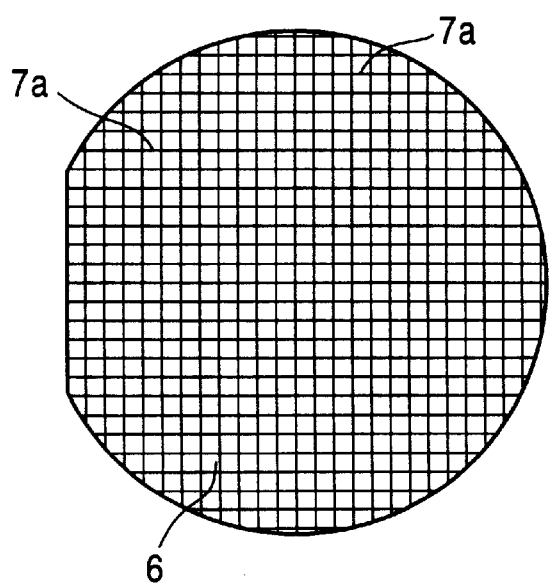
FIG. 2A
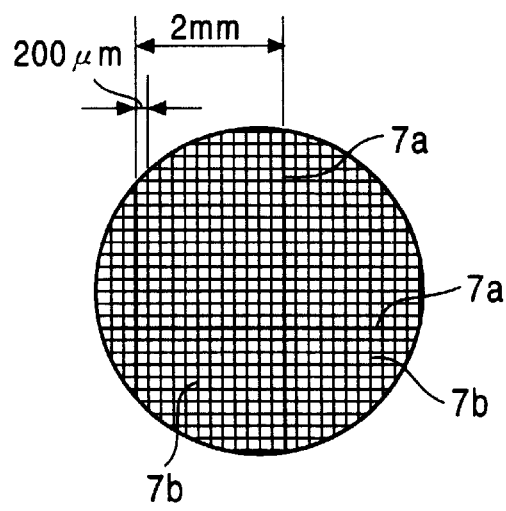
FIG. 2B

METHOD OF FORMING DIAMOND FILM

BACKGROUND OF THE INVENTION

1. Field of the Invention

The present invention relates to a method of forming a diamond film used for electronic devices and sensors, and in particular, to a method of forming a diamond film without delamination from a substrate, in which a large area diamond film can be obtained at a low cost.

2. Description of the Background

Since diamond has excellent heat-resistance and is the hardest of the known substances, it is used for abrasion resistant sections of cutting tools, and the like. Also, diamond has a wide band gap of approximately 5.5 eV, and generally has good insulating properties, although it can function as a semiconductor when doped with impurities. Also, diamond has excellent electrical characteristics, such as a high dielectric breakdown voltage, a high saturation velocity, and a low dielectric constant. Therefore, diamond is expected to be a suitable material for electronic devices and sensors which are used at high temperatures, at high frequencies, and in high electric fields. So far, diamond has been applied to the following fields: a material for an optical sensor or a light emitting device for the short wavelength range of ultraviolet rays or the like, because of the wide band gap; a material for a heat dissipating substrate because of its high thermal conductivity and low specific heat; a surface acoustic wave device because of its high propagation velocity of sound waves; and an X-ray window or optical material because of its high transmittance and refractive index.

In order to maximize the characteristics or performance of diamond in various applications as described above, it is required that a single-crystal diamond film of high quality, in which the defects of the crystal structure are reduced or a coalesced diamond film having coalesced grain boundaries, can be synthesized. Also, a large area diamond film of high quality must be obtained at a low cost in order to implement the applications of the diamond film. Conventionally, single crystals of diamond have been obtained by mining or by synthesis at high temperatures and pressures. However, the resultant diamond film or grain has an area of approximately 1 cm$^2$ at the largest, and the price is very high. Therefore, the fields in which diamond films are industrially used are limited to polishing powder and as a tool edge for high precision cutting tools.

Vapor phase syntheses of diamond films include, for example, the micro-wave chemical vapor deposition (CVD) method disclosed in Japanese Patent Publication Nos. 59-27754 and 61-3320, the high-frequency plasma CVD method, the hot filament CVD method, the direct-current plasma CVD method, the plasma-jet method, combustion method, and the thermal CVD method. In accordance with these vapor phase processes, a large area diamond film can be obtained at a low cost.

In order to industrially implement electronic devices and sensors using diamond films, diamond films having excellent electrical properties must be obtained. That is, a method must be established for synthesizing a single crystal or a coalesced film having a significantly low grain boundary density.

So far, however, a diamond film that is formed by the vapor phase processes on non-diamond substrates such as silicon, is polycrystalline, in which diamond grains are randomly aggregated with a high grain boundary density. If a diamond film has grain boundaries, carriers (i.e., electrons and holes) may be trapped or scattered, resulting in a deterioration of electrical properties, and thus electronic devices and sensors formed from them do not have practical performance characteristics. Also, when there are grain boundaries in a diamond film, light scattering occurs at the grain boundaries, and therefore the transmittance decreases. Also, chipping occurs easily if a diamond film having grain boundaries is used as an abrasion-resistant material.

By using single crystal synthetic diamond or cubic boron nitride as a substrate, a single-crystal diamond film can be formed by a vapor phase process. However, since there is no synthetic diamond or cubic boron nitride having a large area, a large area single-crystal diamond film cannot be formed by the vapor phase process using these substrates.

Recently, a method for synthesizing a single-crystal diamond film on a single crystal platinum substrate was disclosed by Y. Shintani in J. Materials Research, 11, 2955 (1996). However, the single, crystal platinum substrate used in the method is very expensive, and the diamond film obtained is only less than approximately 1 inch in diameter.

A metal film such as platinum is known to grow on in the same crystalline orientation as the oxide substrate such as strontium titanate (epitaxial growth). Therefore, in order to obtain a large area of single-crystal diamond film at a low cost, a method of synthesizing a diamond film on a substrate which includes platinum grown on an oxide such as strontium titanate was developed as disclosed in Japanese Patent Laid-Open No. 9-48693.

However, although a single-crystal diamond film synthesis is achieved by the method described above, the following problems may occur: generally, a diamond film is synthesized at a high temperature of approximately 800° C. When a substrate having a different thermal expansion coefficient from that of a diamond film is used, and then cooled down to room temperature, significantly high stress occurs at the interface between the substrate and the diamond film. The stress causes delamination, cracks, or the like, in the diamond film. Since the thermal expansion coefficient of an oxide such as strontium titanate is significantly different from that of diamond, a diamond film grown on such a substrate easily delaminates from the substrate.

Also, if copper is used as a substrate, since the expansion coefficient of copper is more than ten times as large as that of diamond, delamination of the diamond film occurs, when the diamond film is formed by the vapor phase process at a high temperature of 600° C. or above and the resultant diamond film is cooled down to room temperature, as disclosed by J. F. Denatale, et al., in J. Materials Science, Vol. 27, p.553 (1992).

SUMMARY OF THE INVENTION

The present invention overcomes the difficulties noted above. An object of the invention is to provide a method for forming a diamond film in which a large area diamond film of a single crystal or having coalesced grain boundaries can be formed by a vapor phase process at a low cost.

A method of forming a diamond film in accordance with the present invention includes the steps of providing trenches for preventing delamination of the diamond film from the surface of a base, forming a metal film on the base to fabricate a substrate, and synthesizing a diamond film on the substrate.

Another method of forming a diamond film in accordance with the present invention includes the steps of forming a metal film on a base, providing trenches for preventing delamination of the diamond film from the surface of the metal film to fabricate a substrate, and synthesizing a diamond film on the substrate.

Preferably, each of the trenches has a width of 0.25 to 50 µm, and there is a space of 1 to 1,000 µm between the adjacent trenches for preventing delamination. Also, preferably, the base is composed of at least one material selected from the group consisting of lithium fluoride, calcium fluoride, magnesium oxide, nickel oxide, aluminum oxide, strontium titanate, barium titanate, lead titanate, potassium tantalate, lithium niobate, yttrium oxide, quartz, and silicon. Also included are solid solutions thereof. Additionally, the base may include a plurality of layers, and an outermost layer of the base is preferably composed of at least one material selected from the group mentioned above.

Also, the metal film is preferably composed of at least one metal selected from the group consisting of platinum, iridium, cobalt, nickel, and iron. Also included are alloys thereof. Also, the substrate may have trenches for separating devices at a larger width than that of the trenches for preventing delamination.

In accordance with the present invention, trenches for preventing delamination are provided on the surface of a base, and a diamond film is formed on a substrate obtained by forming a metal film on the base, or a metal film is formed on a base, a diamond film is formed on a substrate provided with trenches for preventing delamination from the surface of the metal film. Since the trenches reduce the regions in which the diamond film and the substrate are in contact with each other, the stress at the interface between the substrate and the diamond film can be dispersed. As mentioned above, in accordance with the present invention, since the substrate is partitioned by trenches, the generated stress does not exceed the adhesion between the diamond film and the substrate. Thus, delamination, cracks, or the like, do not occur in the diamond film even if the diamond film synthesized at high temperatures is cooled on the substrate, and thus a large area single-crystal diamond film or a coalesced diamond film can be formed at a low cost.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a sectional view showing a method of forming a diamond film as an embodiment of the present invention; and FIG. 2A is a plan view showing a wafer provided with trenches, and FIG. 2B is a plan view showing a partially enlarged section of the wafer shown in FIG. 2A.

DETAILED DESCRIPTION OF THE INVENTION

A method of forming a diamond film as an embodiment of the present invention will be described with reference to the attached drawings. FIG. 1 is a sectional view showing a method of forming a diamond film as an embodiment of the present invention. As shown in FIG. 1, after forming a metal film 3 composed of platinum by vapor deposition or the like on a base 1 composed of, for example, strontium titanate, annealing is performed in order to crystallize the metal film 3. Next, a plurality of trenches (for preventing delamination) 2 are provided on the surface of the metal film 3. This will make a substrate 5 for forming a diamond film. Then, a diamond film 4 is formed on the surface of the substrate 5 at approximately 800° by a vapor phase process. The diamond film 4 is formed entirely over the trenches 2 and holes remain at the portions of the trenches 2.

Generally, a diamond film is synthesized at a temperature of 500° C. or more, typically at approximately 800° C. When the thermal expansion coefficient of the substrate is significantly different from that of the diamond film, for example, by 10% or more, the stress generated during film formation is relaxed to a minimum at the film growth temperature. Therefore, if the substrate and the diamond film formed on its surface are cooled, stress occurs owing to the difference in the thermal expansion coefficients. For example, a substrate having a higher thermal expansion coefficient than that of the diamond film shrinks more than the diamond film when cooled. The change in the shrinkage gives a compressive stress to the diamond film, and if the stress exceeds the adhesion of the diamond film to the substrate, delamination or cracks occur in the diamond film. Although the stress occurring at the interface between the substrate and the diamond film greatly depends on the material of the substrate and the method of cooling, in general, the stress increases as the area of the continuously formed diamond film increases.

In this embodiment, however, the diamond film 4 is formed on the surface of the substrate 5 provided with trenches 2. The trenches 2 result in reduction of the area of regions in which the diamond film 4 and the substrate 5 are brought into contact with each other, and thus the stress occurring at the interface between the substrate 5 and the diamond film 4 can be dispersed. Since the maximum stress is determined by a region delimited by the trenches 2, the size of the substrate 5 does not influence the stress generated. As mentioned above, in this embodiment, since the substrate 5 is partitioned by the trenches 2 so that the generated stress does not exceed the adhesion between the diamond film 4 and the substrate 5, delamination, cracks, or the like, do not occur in the diamond film 4 even if the diamond film 4 synthesized at high temperature is cooled together with the substrate 5. Also, in this embodiment, since the diamond film is synthesized by a vapor phase process on the metal film 3 composed of platinum, a large area of single-crystal diamond film or coalesced diamond film can be formed at a low cost.

Although, in the embodiment shown in FIG. 1, the trenches 2 are provided on the surface of the metal film 3 after the metal film 3 is formed on the base 1, in accordance with the present invention, the metal film 3 may be formed after trenches are provided on the surface of the base 1. That is, after trenches having a width of, for example, 50 µm are provided on the surface of the base 1, the metal film 3 composed of platinum is formed on the base 1 at a thickness of, for example, 1 µm by vapor deposition or the like. When the substrate composed of the base and the metal film formed thereon is formed as described above, although the metal film is also formed on side faces and bottoms of the trenches provided on the base in addition to being on the upper surface of the base 1, if the thickness of the metal film is chosen to be significantly smaller in comparison to the width of the trenches, a substrate provided with trenches on the surface is obtained in the'same manner as that in the embodiment shown in FIG. 1. Accordingly, when a diamond film is synthesized on the substrate by a vapor phase process, the diamond film can be formed entirely on the substrate, and since stress occurring at the interface between the diamond film and the substrate can be relieved by the trenches on the substrate, delamination, cracks, or the like, do not occur and a single-crystal diamond film or a coalesced diamond film can be obtained at a low cost. As described above, if trenches are provided on the surface of a base in advance, the manufacturing process of diamond films can be further simplified. In accordance with the present invention, there are no limitations on the order in which trenches are provided as long as they are done prior to the formation of the diamond film.

Although there are no limitations on the width of the trenches 2, in order to obtain a continuous diamond film in the end, the trenches 2 are preferably provided at a width less than twice the thickness of the diamond film obtained. Specifically, In view of the thickness of the diamond film commonly used, the width of the trenches is preferably 50 $\mu$m or less. This is because the diamond film grows perpendicular to the surface of the substrate and at the same time grows parallel to the surface of the substrate, and if the trenches have a width less than twice the thickness of the diamond film, openings will be closed on completion of the diamond film formation to produce a continuous film.

On the other hand, if the width of the trenches is less than 0.25 $\mu$m, the trenches are immediately buried with diamond grains grown in the periphery, and thus the stress cannot be relieved, resulting in delamination of the diamond film from the substrate. Accordingly, the width of the trenches is preferably in the range of 0.25 to 50 $\mu$m. The minimum width of a trench which can be formed by a known etching technique is approximately 0.25 $\mu$m.

If a space between the adjacent trenches exceeds 1,000 $\mu$m, the diamond film formed on the substrate may delaminate from the substrate. On the contrary, if a space between the adjacent trenches is set at less than 1 $\mu$m, the process of providing trenches becomes complex, resulting in an increase in production costs. Accordingly, the space between the adjacent trenches is preferably in the range of 1 to 1,000 $\mu$m, and more preferably, 500 $\mu$m or less.

Although there are no limitations on the depth of the trenches in the present invention, if the depth is less than 0.3 $\mu$m, the trenches do not effectively prevent the delamination of the diamond film from the substrate, depending on the surface roughness of the substrate used. On the other hand, if the trenches have a depth that is 80% or more of the thickness of the substrate, the strength of the substrate may be decreased. Therefore, preferably, the depth of the trenches is 0.3 $\mu$m or more and less than 80% of the thickness of the substrate.

The thickness of a single-crystal diamond film or a coalesced diamond film having coalesced grain boundaries is determined by the vapor phase synthesizing time, and generally, a diamond film having a thickness of 0.1 $\mu$m to several millimeters can be synthesized. The present invention does not exclude the possibility of forming a diamond film having the thickness mentioned above.

Although the base 1 composed of strontium titanate is used in this embodiment, in accordance with the present invention, the base is not limited to the above and may be composed of, for example, lithium fluoride, calcium fluoride, magnesium oxide, nickel oxide, sapphire (aluminum oxide), barium titanate, lead titanate, potassium tantalate, lithium niobate, yttrium oxide, quartz, or silicon. In particular, if (111) crystal planes or (100) crystal planes of the compound or element constituting the bass appear at the surface of the base and the metal film 3 is formed thereon, an amount of preferred crystalline orientation of the diamond film 4 formed on the metal film 3 can be increased.

Also, the base used in the present invention may include a single-crystal layer composed of lithium fluoride, calcium fluoride, magnesium oxide, nickel oxide, sapphire (aluminum oxide), strontium titanate, barium titanate, lead titanate, potassium tantalate, lithium niobate, yttrium oxide, quartz, or silicon in which (111) crystal planes or (100) crystal planes appear on the surface; and an upper layer composed of lithium fluoride, calcium fluoride, magnesium oxide, nickel oxide, sapphire (aluminum oxide), strontium titanate, barium titanate, lead titanate, potassium tantalate, lithium niobate, yttrium oxide, quartz, or silicon which is deposited on the single-crystal layer by a vapor phase process.

When a substrate obtained by forming a metal film on a base composed of strontium titanate is used, although a single-crystal diamond film of high quality can be obtained, the cost of materials increases and the size of the substrate is restricted. On the other hand, when a substrate obtained by forming a metal film on a base composed of sapphire (aluminum oxide) is used, although the amount of preferred orientation of crystals decreases in comparison with the case in which the base composed of strontium titanate is used, a large area of diamond film can be obtained at a low cost. Therefore, if a strontium titanate layer can be grown in the same crystalline orientation on a single-crystal layer composed of, for example, sapphire (aluminum oxide) to form a base, a large area of diamond film of high quality can be formed on a substrate using the base at a low cost.

Although the metal film 3 composed of platinum is formed on the base 1 in this embodiment, in accordance with the present invention, the metal film is not limited to the above. For example, a metal film composed of at least one metal selected from the group consisting of platinum, iridium, cobalt, nickel, and iron may be formed on the base. If (111) crystal planes or (001) crystal planes of the metal constituting the metal film are oriented parallel to the surface of the base 1, an amount of preferred crystalline orientation of the diamond film 4 formed on the metal film 3 can be further increased. However, a similar effect may be obtained even if the crystal planes are inclined in relation to the surface of the base 1 by several degrees. Also, the metal film 3 is not necessarily a single-crystal film. For example, a diamond film may be allowed to have a small grain boundary density depending on the application field of the diamond film, and in such a case, the metal film may have a low amount of preferred crystalline orientation. Even if the metal film is a microcrystalline film or polycrystalline film in which crystals having a grain diameter of 10 nm or less are aggregated, by providing trenches on the surface of the substrate, delamination of the diamond film from the substrate can be prevented.

Also, in the present invention, there are no limitations with respect to a method of forming and annealing a metal film. For example, as a method of forming a metal film, a known process such as sputtering or electron beam vapor deposition may be used, and a known method may be used also for its annealing. The formation and annealing of the metal film may be performed at the same time in one process, or may be performed in separate processes. Also, in the present invention, in order to provide the trenches 2 on the surface of the substrate 5, trenching with a cutter such as a dicing saw or the like, or etching or the like is performed.

Also, in order to form the diamond film 4 on the substrate 5, a known technique such as a microwave CVD method, a plasma-jet method, a combustion method, or a thermal CVD method may be used, and a similar effect can be achieved by using any one of the above methods.

FIG. 2A is a plan view showing a wafer provided with trenches, and FIG. 2B is a plan view showing a partially enlarged section of the wafer shown in FIG. 2A. A diamond film is formed on the surface of a wafer provided with trenches, and after a predetermined treatment is performed, the wafer is separated into a plurality of devices in a manner described below. First, trenches 7a and 7b are provided on the surface of a wafer 6. The trenches 7a are for separating the wafer into a plurality of devices and the width of the trenches 7a is set sufficiently greater than the thickness of the diamond film. Also, the trenches 7b are for preventing delamination, and a plurality of trenches 7b are provided between the trenches 7a. The trenches 7b have a width that is narrower than that of the trenches 7a. That is, in this embodiment, two types of trenches having a different width are provided on the surface of the wafer. A space between the trenches 7a corresponds to the size of a device to be fabricated, and the trenches 7a are spaced, for example, 2 mm apart. Also, the trenches 7b are spaced, for example, 200 µm apart. A diamond film is synthesized on the wafer 6 in a manner similar to that shown in FIG. 1.

By synthesizing the diamond film as described above, the wafer 6 can be easily separated along the trenches 7a into a plurality of devices, and there is no delamination of the diamond film on the surface of any device.

In this embodiment, by providing the trenches 7a and 7b in the same direction as the {111} orientation when (111) crystal planes appear on the surface of the wafer, and by providing the trenches 7a and 7b in the same direction as the {001} orientation when (100) crystal planes appear on the surface of the wafer, the cutting directions of the substrate agree with the cleavage directions of crystals. Thus, the wafer 6 can be cut along the crystalline orientation without applying unnecessary stress to the diamond film on the surface of the substrate. Accordingly, by defining the cutting direction, delamination of the diamond film which might easily occur in the device separation step can be prevented.

Testing results of forming diamond films by the methods in accordance with the present invention will be specifically described in comparison with the testing results of comparative examples.

EXAMPLES

Having generally described this invention, a further understanding can be obtained by reference to certain specific examples which are provided herein for purposes of illustration only and are not intended to be limiting unless otherwise specified.

Example 1

In Example No. 1, on the entire surface of a base composed of single crystal strontium titanate (SrTiO₃) in which (111) crystal planes appeared on the surface, trenches were provided with a dicing saw. The width of the trenches was 20 µm, and the space between the adjacent trenches was 200 µm. As Comparative Example No. 1, a base composed of the same material without trenches was prepared. On these bases, metal films composed of platinum were formed at a thickness of 4 µm by magnetron sputtering with temperatures being retained at 300° C. or more to fabricate substrates. The metal films were evaluated by X-ray diffraction and reflection high energy electron diffraction (RHEED). Both in Example No. 1 and in Comparative Example No. 1, the interfaces between the metal films and the strontium titanate bases had epitaxial growth, and the metal films were single-crystal films in which (111) crystal planes appeared on the surfaces.

In order to accelerate the generation of nuclei of diamond, ultrasonic waves were applied to the substrates placed in diamond powder. Then, diamond films were formed by a vapor phase process with a microwave CVD system using a mixed gas of hydrogen and methane containing 0.2 to 0.8% by volume of methane gas. The synthesis was performed under the following conditions: a total gas flow rate of 100 sccm, a pressure in the reactor of 30 to 60 Torr, the temperature of the substrates at 800 to 900° C., and a synthesizing time of 30 hours.

As a result, with respect to Example No. 1, adjacent diamond grains were coalesced and a single-crystal diamond film in which (111) crystal planes appeared on the surface was formed without delamination. With respect to Comparative Example No. 1, although a coalesced film in which adjacent diamond grains were coalesced was obtained, many delaminated parts were observed on the surface.

Example 2

Two bases composed of single crystal strontium titanate in which (001) crystal planes appeared on the surfaces were prepared. As Example No. 2, one of the bases was provided with trenches in the same manner as in Example 1, and as Comparative Example No. 2, another base was used without providing trenches. Next, metal films composed of platinum were formed on these bases by vapor deposition under the same conditions as those in Example 1 to fabricate substrates. Then, diamond films were formed by a vapor phase process with a microwave CVD system using a mixed gas of hydrogen and methane containing 0.8 to 7.0% by volume of methane gas. The temperature of the substrates was set at 700 to 850° C., the synthesis was performed for 4 hours, and other conditions were the same as those in Example 1.

As a result, with respect to Example No. 2 and Comparative Example No. 2, diamond grains having uniform crystalline orientations were precipitated. Then, under the same conditions, the vapor phase process was performed for a further 10 hours. With respect to Example No. 2 and Comparative Example No. 2, adjacent diamond grains were coalesced and single-crystal diamond films in which (001) crystal planes appeared on the surface were obtained. Although there was no delamination, cracks, or the like in the diamond film obtained in Example No. 2, delamination was observed in 46% of the substrate area of the diamond film of Comparative Example No. 2 and also cracks occurred.

Example 3

On a single-crystal layer composed of magnesium oxide in which (001) crystal planes appeared on the surface, an upper layer composed of strontium titanate was grown by a molecular beam epitaxial growth system to fabricate a base. As a result of the evaluation by X-ray diffraction and RHEED, the strontium titanate layer was a single-crystal film having the same crystalline orientation as that of the magnesium oxide layer. Next, under the same conditions as those in Example 1, Example No. 3 in which trenches were provided on the entire surface of the base and Comparative Example No. 3 without trenches were prepared. After metal films composed of platinum were formed by vapor deposition on the surfaces of the bases, diamond films were formed by a vapor phase process with a synthesizing time of 24 hours.

As a result, with respect to Example No. 3 and Comparative Example No. 3, single-crystal diamond films in which (001) crystal planes appeared on the surfaces were obtained. Although there was no delamination, cracks, or the like in the diamond film obtained in Example No. 3, delamination was observed in 72% of the substrate area of the diamond film of Comparative Example No. 3 and also cracks occurred.

Example 4

Two substrates having the same structure as Example 1 were prepared. One substrate was provided with trenches as Example No. 4, and another substrate was not provided with trenches as Comparative Example No. 4. A mixed gas of hydrogen and methane containing 0.2 to 0.8% by volume of methane gas was fed into a reactor at a flow rate of 100 sccm, and a pressure in the reactor was retained at 30 to 60 Torr. Next, a hot filament placed above the substrate 8 mm apart was heated to 2,200° C., and the temperature of the substrate was set at 800 to 950° C. by adjusting a substrate heater and was retained for 30 to 60 minutes. After the temperature of the substrate was raised to 1,300 to 1,400° C. and retained for 1 to 5 minutes, the temperature of the substrate was again set at 800 to 950° C., and the synthesis was performed for 30 hours.

As a result, with respect to Example No. 4 and Comparative Example No. 4, single-crystal diamond films in which (111) crystal planes appeared on the surfaces were obtained. Although there was no delamination, cracks, or the like in the diamond film obtained in Example No. 4, delamination was observed in 53% of the substrate area of the diamond film of Comparative Example No. 4.

Example 5

Two substrates having the same structure as Example 1 were prepared. One substrate was provided with trenches as Example No. 5, and another substrate was not provided with trenches as Comparative Example No. 5. Diamond films were synthesized on the substrates by a DC plasma jet CVD method, using a mixed gas of hydrogen and methane containing 1.0% by volume of methane gas. The pressure in the reactor was retained at 60 Torr, the temperature of the substrates was set at 850° C., and the synthesis was performed for 4 hours.

As a result, with respect to Example No. 5 and Comparative Example No. 5, single-crystal diamond films in which adjacent diamond grains were coalesced and (111) crystal planes appeared on the surfaces were obtained. Although there was no delamination in the diamond film obtained in Example No. 5, delamination was observed in 62% of the substrate area of the diamond film of Comparative Example No. 5.

Example 6

Two substrates having the same structure as Example 2 were prepared. One substrate was provided with trenches as Example No. 6, and another substrate was not provided with trenches as Comparative Example No. 6. Diamond films were synthesized on the substrates by a combustion method. That is, a mixed gas of acetylene and oxygen was fed into a gas burner for welding at a rate of 2 liters per minute, and a length of the flame was set at approximately 25 cm. A water-cooled substrate support was placed at a position 10 mm apart from the burner top in an inner flame, the temperature of the substrate was set at 850 to 890° C., and vapor phase synthesis was performed in air for one hour.

As a result, with respect to Example No. 6 and Comparative Example No. 6, single diamond films in which adjacent diamond grains were coalesced and (001) crystal planes appeared on the surfaces were obtained. Although there was no delamination in the diamond film obtained in Example No. 6, delamination was observed in 80% of the substrate area of the diamond film of Comparative Example No. 6.

Example 7

Trenches were provided by a dicing saw on the entire surface of a base, having a diameter of 1 inch, composed of single crystal strontium titanate in which (111) crystal planes appeared on the surface. Four bases were prepared as Examples No. 7, No. 8, No. 9, and No. 10, by setting a width of the trenches at 10 µm, 20 µm, 50 µm, and 100 µm, respectively. Every space between the adjacent trenches was set at 250 µm. Next, under the same conditions as Example 1, metal films composed of platinum were formed on the bases by vapor deposition to fabricate substrates, and then, diamond films were formed on the substrates by performing vapor phase synthesis for 30 hours.

As a result, with respect to all the substrates, diamond films having uniform crystalline orientations were formed without delamination. In Example No. 7 and Example No. 8, openings on the surfaces were buried, and the interfaces were not observed even by a scanning electron microscope. With respect to the diamond film formed on the substrate with trenches having a width of 50 µm (Example No. 9), initial openings were mostly buried. Then, by continuing the vapor phase synthesis under the same conditions for 30 hours, regions divided by the trenches were coalesced and a continuous single-crystal diamond film, having a diameter of 1 inch, in which (111) crystal planes appeared on the surface was formed without delamination. With respect to the diamond film formed on the substrate with trenches having a width of 100 µm (Example No. 10), the adjacent diamond films with trenches therebetween were not coalesced, and a mosaic diamond film was formed.

Example 8

On the entire surface of a bass, having a diameter of 1 inch, composed of single crystal strontium titanate in which (111) crystal planes appeared on the surface, trenches having a width of 20 µm were provided with a dicing saw. Four bases were prepared as Examples No. 11, No. 12, No. 13, and No. 14, by setting a space between the adjacent trenches at 100 µm, 200 µm, 500 µm, and 1,000 µm, respectively. Next, under the same conditions as Example 1, metal films composed of platinum were formed on the bases by vapor deposition to fabricate substrates, and then, diamond films were formed on the substrates by performing vapor phase synthesis for 20 hours.

As a result, on all the substrates, diamond films having uniform crystalline orientations were formed, and Example Nos. 11, 12, and 13 were more effective in preventing delamination in comparison to Example No. 14.

Example 9

On the entire surface of a base, having a diameter of 1 inch, composed of single crystal strontium titanate in which (100) crystal planes appeared on the surface, trenches having a width of 20 µm were provided by a dicing saw. The space between the adjacent trenches was 200 µm. Two bases were prepared. In one base, the trenches were provided in the [001] direction, and in another base, the trenches were provided in a random direction. Also, as shown in FIG. 2B, after the diamond films were formed, in order to separate 2 mm square diamond electronic devices, a trench having a width of 120 µm was provided every 10 trenches mentioned above. Next, under the same conditions as Example 1, metal films composed of platinum were formed on the bases by vapor deposition to fabricate substrates, and then, diamond films were formed on the substrates by performing vapor phase synthesis for 50 hours.

As a result, grooves were formed on the diamond films lying on the trenches having a width of 120 μm, and thus a mosaic diamond film including 2 mm square diamond films was obtained. When the substrates were cut off along the grooves, the substrate in which the trenches were provided in the [001] direction was divided into a plurality of diamond electronic devices without delamination. The substrate in which the trenches were provided in a random direction, delamination occurred while the substrate was being cut off.

Example 10

A base composed of single crystal magnesium oxide (MgO) in which (111) crystal planes appeared on the surface was prepared. After trenches were provided on the surface of the bass in the similar manner as in Example 1, a metal film composed of platinum was deposited on the base at a thickness of 10 μm by a magnetron sputtering method or a RF sputtering method to fabricate a substrate. The temperature of the substrate was retained at 500 to 800° C. during deposition. The metal film obtained was evaluated by X-ray diffraction and RHEED. Although the interface between the metal film and the magnesium oxide base had epitaxial growth, the metal film was a polycrystalline film in which (001) crystal planes appeared on the surface. Then, under the same conditions as Example 1, a diamond film was synthesized by a vapor phase process. As a result, a single-crystal diamond film in which (111) crystal planes appeared on the surface was formed without delamination.

Example 11

Bases composed of various materials were prepared, and platinum thin films were deposited on them. The resultant platinum thin films were evaluated by X-ray diffraction and RHEED. As a result, when lithium fluoride, calcium fluoride, magnesium oxide, nickel oxide, sapphire (aluminum oxide), strontium titanate, barium titanate, lead titanate, potassium tantalate, and lithium niobate were used as materials for the bases, platinum thin films in which (111) crystal planes appeared on the surfaces were formed. Then, after the substrates obtained as described above were provided with trenches, diamond films were synthesized on the substrates by a vapor phase process. Single-crystal diamond films were formed without delamination.

As described above, in accordance with the present invention, since a diamond film is synthesized on a substrate provided with trenches for preventing delamination or on a substrate in which a metal film is formed on a base provided with trenches for preventing delamination, stress occurring at the interface between the substrate and the diamond film can be relieved, and delamination of the diamond film from the substrate can be prevented, and thus a large area of diamond film of a single crystal or having coalesced grain boundaries can be easily formed at a low cost. Since the large area of diamond film of a single crystal or having coalesced grain boundaries obtained in the present Invention is applicable to various fields, the present invention will greatly contribute to the industrial development in the related fields.

Obviously, numerous modifications and variations of the present invention are possible in light of the above teachings. It is therefore to be understood that within the scope of the appended claims, the invention may be practiced otherwise than as specifically described herein.

The priority document of the present application, Japanese Patent Application No. Hei 10-20387 filed Jan. 16, 1998, is hereby incorporated by reference.

What is claimed is:

1. A method of forming a diamond film of a single crystal or having coalesced grain boundaries, comprising:
   synthesizing a diamond film on a surface of a substrate;
   wherein said surface of said substrate comprises first trenches, and wherein said first trenches reduce regions in which the diamond film and the substrate are in contact with each other, and wherein each of said first trenches has a width of 0.25 to 50 μm.

2. The method of claim 1, wherein said substrate comprises a metal film on a surface of a base, and said surface of said substrate is a surface of said metal film.

3. The method of claim 2, wherein said substrate is obtained by:
   forming said metal film on said surface of said base; and
   providing said first trenches on said surface of said metal film, to fabricate said substrate.

4. The method of claim 2, wherein said substrate is obtained by:
   providing said first trenches on said surface of said base; and
   forming said metal film on said surface of said base, to fabricate said substrate.

5. The method of claim 2, wherein the interval between adjacent trenches is 1 to 1,000 μm.

6. The method of claim 2, wherein said base comprises at least one first material selected from the group consisting of lithium fluoride, calcium fluoride, magnesium oxide, nickel oxide, aluminum oxide, strontium titanate, barium titanate, lead titanate, potassium tantalate, lithium niobate, yttrium oxide, quartz, silicon and solid solutions thereof.

7. The method of claim 6, wherein said base comprises a single crystal layer and an upper layer formed on a surface of said single crystal layer by vapor deposition,
   said single-crystal layer comprises said at least one first material,
   said surface of said single crystal layer is one crystal plane selected from the group consisting of a (111) crystal plane and a (100) crystal plane, and
   said upper layer comprises at least one second material selected from the group consisting of lithium fluoride, calcium fluoride, magnesium oxide, nickel oxide, aluminum oxide, strontium titanate, barium titanate, lead titanate, potassium tantalate, lithium niobate, yttrium oxide, quartz, silicon and solid solutions thereof.

8. The method of claim 2, wherein said metal film comprises at least one metal selected from the group consisting of platinum, iridium, cobalt, nickel, and iron.

9. The method of claim 2, wherein said surface of said base is one crystal plane selected from the group consisting of a (111) crystal plane and a (100) crystal plane.

10. The method of claim 2, wherein said metal film is selected from the group consisting of a single-crystal film, a polycrystalline film and microcrystalline film.

11. The method of claim 2, wherein one crystal plane of said metal film selected from the group consisting of a (111) crystal plane and a (001) crystal plane, is oriented parallel to said surface of said base.

12. The method of claim 2, wherein said surface of said substrate comprises second trenches having a width larger than a width of said first trenches.

13. The method of claim 2, wherein said surface of said metal film is a (111) crystal plane, and said first trenches are along the {111} direction, or said surface of said metal film is a (100) crystal plane, and said first trenches are along the {001} direction.

* * * * *